US008727328B2

(12) United States Patent
Lee

(10) Patent No.: US 8,727,328 B2
(45) Date of Patent: May 20, 2014

(54) INSERT FOR HANDLER

(75) Inventor: Jae Hak Lee, Gyeonggi-do (KR)

(73) Assignee: ISC Co., Ltd., Gyeonggi-do (KR)

( * ) Notice: Subject to any disclaimer, the term of this patent is extended or adjusted under 35 U.S.C. 154(b) by 133 days.

(21) Appl. No.: 13/395,146

(22) PCT Filed: Jun. 24, 2010

(86) PCT No.: PCT/KR2010/004109
§ 371 (c)(1),
(2), (4) Date: Mar. 9, 2012

(87) PCT Pub. No.: WO2011/162430
PCT Pub. Date: Dec. 29, 2011

(65) Prior Publication Data
US 2012/0200024 A1    Aug. 9, 2012

(51) Int. Cl.
*B23Q 3/00* (2006.01)
*H01R 13/62* (2006.01)
*H01R 13/15* (2006.01)
*G01R 31/26* (2006.01)

(52) U.S. Cl.
USPC .................. 269/289 R; 439/330; 439/263

(58) Field of Classification Search
USPC .................. 269/289 R; 439/330, 263, 266
See application file for complete search history.

(56) References Cited

U.S. PATENT DOCUMENTS

| 5,482,471 | A | * | 1/1996 | Mori et al. | 439/263 |
| 5,493,237 | A | * | 2/1996 | Volz et al. | 324/756.05 |
| 6,350,138 | B1 | * | 2/2002 | Atobe et al. | 439/266 |
| 6,739,894 | B2 | * | 5/2004 | Ogura | 439/330 |
| 6,752,645 | B2 | * | 6/2004 | Nakamura et al. | 439/330 |
| 7,230,830 | B2 | * | 6/2007 | Ujike et al. | 361/704 |
| 7,891,864 | B2 | * | 2/2011 | Yazawa et al. | 374/29 |

FOREIGN PATENT DOCUMENTS

| JP | 2001-116795 A | 4/2001 |
| KR | 1020050092211 A | 9/2005 |
| KR | 1020060125136 A | 12/2006 |
| KR | 1020070109721 A | 11/2007 |

OTHER PUBLICATIONS

International Search Report: mailed Mar. 8, 2011; PCT/KR2010/004109.

* cited by examiner

*Primary Examiner* — Alvin Grant
(74) *Attorney, Agent, or Firm* — Ladas & Parry LLP

(57) ABSTRACT

An insert for a handler which may be easily replaced when damaged because a semiconductor device is often received in the insert. The insert in which the semiconductor device including a plurality of terminals is received and which allows the semiconductor device to contact an external contactor includes: an insert body that has a through-hole which is formed in a central portion of the insert body and into which the semiconductor device is to be inserted; and a support member that crosses the through-hole to be detachably coupled to the insert body and supports the semiconductor device inserted into the through-hole, wherein a plurality of communication holes are formed to correspond in position to the terminals of the semiconductor device and to pass through the support member from a top surface to a bottom surface of the support member such that the terminals and the external contactor are brought into contact with each other.

6 Claims, 5 Drawing Sheets

INSERT FOR HANDLER

TECHNICAL FIELD

The present invention relates to an insert for a handler, and more particularly, to an insert for a handler which may be easily replaced when damaged because a semiconductor device is often received in the insert.

BACKGROUND ART

In general, semiconductor memory devices manufactured by using a semiconductor manufacturing process undergo a reliability test such as an electrical property test or a function test. The manufactured semiconductor devices are transported to a tester. An insert for a handler is often used to classify the semiconductor devices that have been tested.

A handler carries a plurality of semiconductor devices into a tester and the plurality of semiconductor devices are brought into electrical contact with a test head to be tested. The handler takes the plurality of semiconductor devices that have been tested out of the tester and classifies the plurality of semiconductor devices according to a test result.

In this case, in order to conduct a test, the handler may carry a test tray on which inserts in which the plurality of semiconductor devices are received are mounted into the tester.

FIG. 1 is a cross-sectional view illustrating a case where a semiconductor device 10 is carried into a tester 20 for testing an electrical function of the semiconductor device 10 by using a conventional insert 1 for a handler. FIG. 2 is a cross-sectional view illustrating a case where the conventional insert 1 of FIG. 1 is loaded in the tester 20. The conventional insert 1 in which the semiconductor device 10 is received has a stepped portion 3 that inwardly protrudes from a lower end of a through-hole 2 that vertically passes through the insert 1 from an upper end to a lower end of the insert 1. The conventional insert 1 carries the semiconductor device 10 into the tester 20 in a state where a circumferential portion 11 of the semiconductor device 10 is supported by the stepped portion 3.

The conventional insert 1 has the following disadvantages:

The stepped portion 3 is made small to slightly support the circumferential portion 11 of the semiconductor device 10 so that terminals of the semiconductor device 10 easily contact the tester 20. Accordingly, since the stepped portion 3 has a small size, the stepped portion 3 is vulnerable to impact and may be easily damaged when the stepped portion 3 contacts the semiconductor device 10. Once the stepped portion 3 is damaged, the conventional insert 1 itself needs to be replaced.

Also, once the stepped portion 3 is damaged, the semiconductor device 10 may directly drop into a test socket, thereby damaging the test socket. Also, the damaged stepped portion 3 may remain in the test socket.

Also, since the stepped portion 3 protrudes inwardly, the tester 20 to be coupled with the conventional insert 1 needs to have a groove into which the stepped portion 3 is inserted. For example, in this case, an additional process of forming a groove corresponding to the stepped portion 3 that protrudes inwardly needs to be performed on a predetermined portion of the tester 20, thereby increasing overall manufacturing costs.

DETAILED DESCRIPTION OF THE INVENTION

Technical Problem

The present invention provides an insert for a handler which may be replaced at low costs when damaged due to contact with a semiconductor device.

Technical Solution

According to an aspect of the present invention, there is provided an insert for a handler in which a semiconductor device including a plurality of terminals is received and which allows the semiconductor device to contact an external contactor, the insert including: an insert body that has a through-hole which is formed in a central portion of the insert body and into which the semiconductor device is to be inserted; and a support member that crosses the through-hole to be detachably coupled to the insert body and supports the semiconductor device inserted into the through-hole, wherein a plurality of communication holes are formed to correspond in position to the terminals of the semiconductor device and to pass through the support member from a top surface to a bottom surface of the support member such that the terminals and the external contactor are brought into contact with each other.

The support member, which is a thin sheet, may be a film formed of a synthetic resin.

The film may be a Kapton film having a high thermal resistance and a low thermal expansion coefficient.

The film may be any one of an FR4 film, an FR5 film, an XPC film, and a polyimide film.

The communication holes may have diameters large enough for the terminals to be inserted into the communication holes, and thus, the terminals may contact the external contactor through the communication holes.

The communication holes may have diameters large enough for the external contactor to be inserted into the communication holes, and thus, the terminals may contact the external contactor through the communication holes.

The support member may be coupled to a lower end of the insert body with bolts.

Advantageous Effects

An insert for a handler according to the present invention may be easily manufactured and tested because a support member for supporting a semiconductor device is detachably attached to an insert body.

Also, the insert may not apply an impact to the semiconductor device and may not damage terminals of the semiconductor device when contacting the semiconductor device because the support member is a film formed of a synthetic resin.

Also, the semiconductor device may be certainly electrically connected because a terminal of the semiconductor device may contact a external conductor through communication holes formed in the support member.

Also, the insert may be easily replaced and reduce overall test costs because when the support member is damaged due to often contact with the semiconductor device, a new test may be conducted by simply replacing only the support member.

BEST MODE

Figure 1:
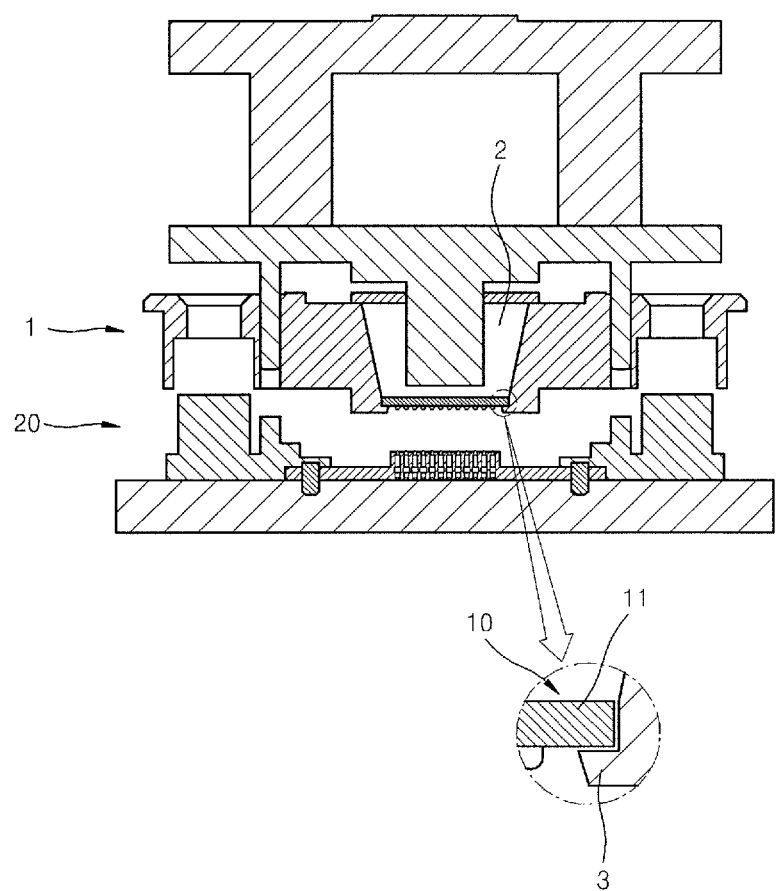
FIG. 1 is a cross-sectional view illustrating a conventional insert for a handler.
Figure 2:
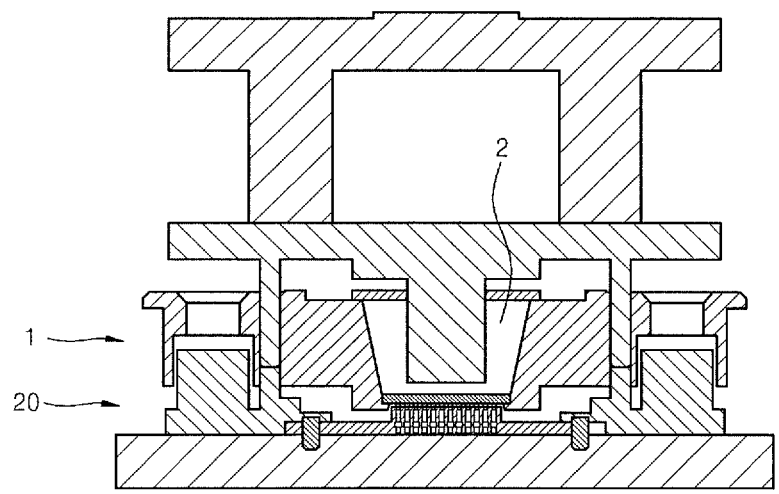
FIG. 2 is a cross-sectional view illustrating an operation of the conventional insert of FIG. 1.
Figure 3:
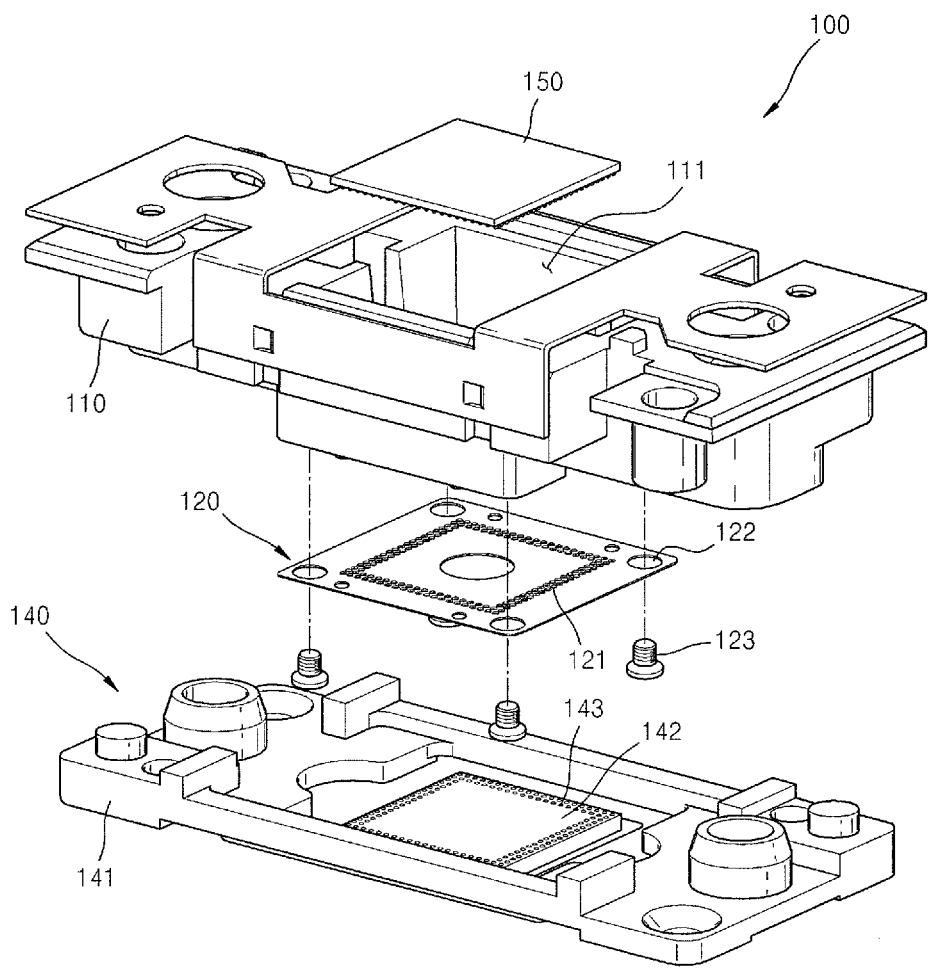
FIG. 3 is an exploded perspective view illustrating an insert for a handler, according to an embodiment of the present invention.
Figure 4:
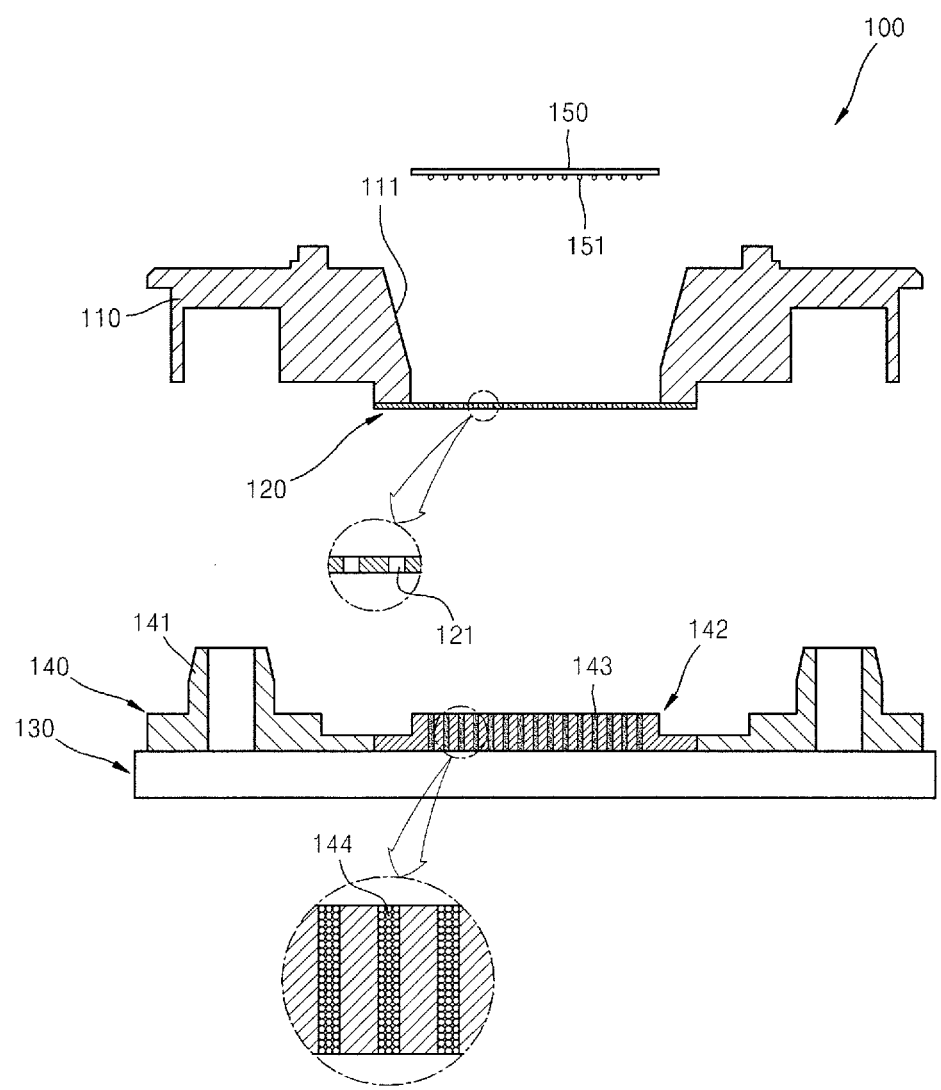
FIGS. 4 and 5 are cross-sectional views illustrating an operation of the insert of FIG. 3.
Figure 5:
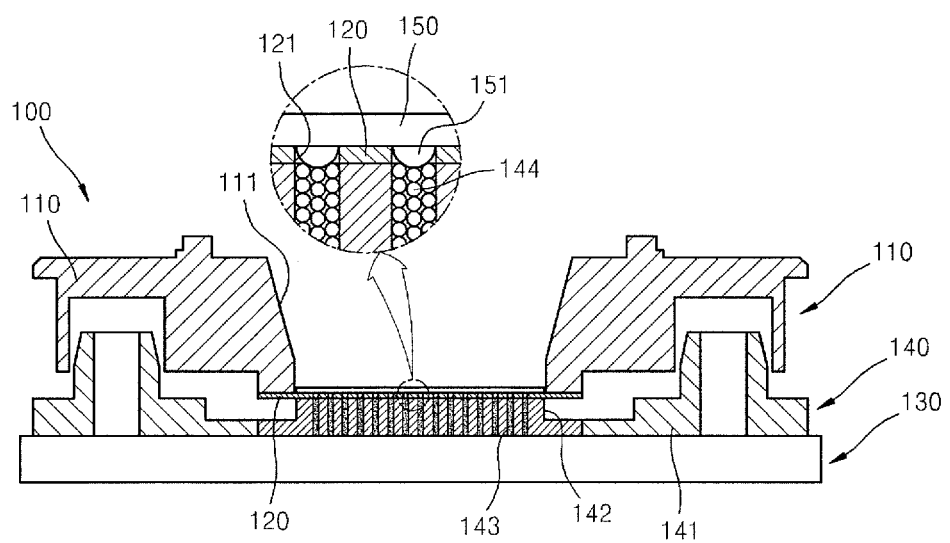

The present invention will now be described more fully with reference to the accompanying drawings, in which exemplary embodiments of the invention are shown. FIG. 3 is an exploded perspective view illustrating an insert 100 for a handler, according to an embodiment of the present invention. FIGS. 4 and 5 are cross-sectional views illustrating an operation of the insert 100 of FIG. 3. Referring to FIGS. 3 through 5, the insert 100 includes an insert body 110 and a support member 120.

The insert body 110 has a through-hole 111 which is formed in a central portion of the insert body 110 and into which a semiconductor device 150 is to be inserted. The through-hole 111 extends from an upper end to a lower end of the insert body 110. A size of the through-hole 111 may be large enough for the semiconductor device 150 to be tested to be inserted into the through-hole 111.

The support member 120 supports the semiconductor device 150 inserted into the through-hole 111 so that the semiconductor device 150 is received in the insert body 110. The support member 120 crosses the through-hole 111 and is detachably coupled to the insert body 110. The support member 120 may be a thin sheet having a size large enough to completely cover the through-hole 111. The support member 120 may be a film formed of a synthetic resin such as an FR4, FR5, XPC, or polyimide film. Most preferably, the support member 120 may be a Kapton film having a high thermal resistance and a high thermal expansion coefficient. The Kapton film is a polyimide film having a high thermal resistance (for, for example, about 250 to 300° C.), high freezing resistance, high chemical resistance, high insulation, and high voltage resistance. Since the Kapton film is elastic, a metal thin film formed of aluminum or the like may be formed on a surface of the Kapton film in order to reinforce the Kapton film.

If the Kapton film is used, a burn-in test for electronic components may be conducted at a high temperature. That is, even during a burn-in test conducted at a high temperature, since the support member 120 may not warp downward and maintain its original position, terminals 151 of the semiconductor device 150 to be tested may be inserted into desired communication holes 121.

The communication holes 121 and coupling holes 122 are formed in the support member 120.

The communication holes 121 are formed to correspond in position to the terminals 151 of the semiconductor device 150 and to pass through the support member 120 from a top surface to a bottom surface of the support member 120. The terminals 151 of the semiconductor device 150 are brought into contact with a contactor 143 to be electrically connected to the contactor 143 through the communication holes 121. Sizes of the communication holes 121 may be slightly larger than those of the terminals 151 of the semiconductor device 150. Accordingly, the terminals 151 of the to semiconductor device 150 may be inserted into the communication holes 121 to protrude downward and to contact the contactor 143 disposed under the insert 100.

The number of communication holes 121 may be equal to the number of terminals 151 of the semiconductor device 150.

The coupling holes 122 are formed to couple the support member 120 to the insert body 110 with bolts 123. The coupling holes 122 are formed to have diameters corresponding to outer diameters of the bolts 123.

In order to detachably couple the support member 120 to the lower end of the insert body 110, not only the bolts 123 but also other fastening members may be used.

Reference numerals 130 and 140 respectively denote a tester and a connector. The tester 130 generates an electrical signal to be applied to the semiconductor device 150, and the connector 140 is disposed between the tester 130 and the insert 100 and electrically connects the terminals 151 of the semiconductor device 150 received in the insert 100 to pads (not shown) of the tester 130.

The connector 140 mounted on the tester 130 includes a connector body 141 and an elastic sheet 142. The connector body 141 is shaped such that the insert 100 is loaded in the connector body 141, and the elastic sheet 142 is disposed at a central portion of the connector body 141.

The elastic sheet 142 allows electrical connection only in a thickness direction. The elastic sheet 142 includes the contactor 143 that electrically connects the terminals 151 and the pads, respectively. The contactor 143 includes an elastic insulator (not shown) and a plurality of conductive particles 144. When the contactor 143 is vertically pressed, the conductive particles 144 contact one another to electrically connect an upper end and a lower end of an elastic sheet 142.

The elastic insulator may be a silicone rubber, a polybutadiene rubber, a natural rubber, polyisoprene rubber, a conjugated diene-based rubber such as a styrene-butadiene copolymer rubber or an acrylonitrile-butadiene copolymer rubber, a hydrogen additive thereof, a block copolymer rubber such as a styrene-butadiene-diene block copolymer rubber, or a styrene-isoprene block copolymer, a hydrogen additive thereof, chloroprene, a urethane rubber, a polyester-based rubber, an epichlorohydrin rubber, an ethylene-propylene copolymer rubber, an ethylene-propylene-diene copolymer rubber, or a liquid epoxy rubber. From among the materials, a silicone rubber has excellent processability and excellent electrical properties, and a natural rubber has excellent electrical properties.

The conductive particles 144 are each formed by forming a cover layer including a noble metal on a surface of a magnetic core particle. Examples of a material of the magnetic core particle may include a ferromagnetic metal such as iron, nickel, cobalt, or an alloy thereof, an inorganic material particle such as a non-magnetic metal particle or a is glass bead, or a polymer particle plated with a ferromagnetic metal. Alternatively, the noble metal included in the cover layer may be gold, silver, platinum, palladium, rhodium, iridium, or an alloy thereof.

The insert 100 operates as follows.

First, the semiconductor device 150 carried by a predetermined transportation unit is inserted into the through-hole 111 of the insert body 110. Next, the semiconductor device 150 is mounted on the support member 120 to be stably supported by the support member 120. In this case, the terminals 151 of the semiconductor device 150 may protrude downward by passing through the communication holes 121. Next, the semiconductor device 150 is pressed by a predetermined pressure unit (not shown) not to be separated from the support member 120. Next, the insert 100 is coupled to the connector 140 loaded in the tester 130. In detail, the terminals 150 of the semiconductor device 150 received in the insert 100 are aligned to be connected to the contactor 143 of the connector 140. Next, when an electrical signal is applied from the semiconductor device 150, the signal is transmitted through the connector 140 to the semiconductor device 150, and thus, a predetermined electrical test is conducted.

The insert 100 has the following advantages:

Although a conventional insert has a predetermined stepped portion formed on an insert body in order to support a semiconductor device, the stepped portion which is small may be easily damaged and once the stepped portion is damaged, the conventional insert needs to be entirely replaced.

However, since the support member 120 is detachably provided, even when the support member 120 is damaged, only the support member 120 is replaced. Also, since the support member 120 is formed of a soft synthetic resin, the support member 120 is not easily damaged due to impact that occurs when the support member 120 contacts the semiconductor device 150.

Also, when the stepped portion of the conventional insert is damaged, fractions of the stepped portion may drop into a tester, thereby increasing the risk of malfunction. However, the support member 120 of the insert 100 has no risk of being fractured when damaged.

Also, since the semiconductor device has to have a size small enough to be is supported by the stepped portion of the conventional insert, there is a limitation in the semiconductor device to be tested. However, the insert 100 may freely use any semiconductor device as long as the semiconductor device 150 may be inserted into the through-hole 111.

Also, although a tester (not shown) disposed under the conventional insert has to have a groove conforming to the stepped portion of the conventional insert, the insert 100 does not require a stepped portion and thus the tester 130 does not need to have a groove.

Mode Of The Invention

The afore-described insert may be modified as follows.

First, although terminals of a semiconductor device are inserted through communication holes to contact a contactor disposed under the semiconductor device in the above embodiments, the present invention is not limited thereto. That is, the contactor may protrude upward through the communication holes to have a protruding portion, and the protruding portion of the contactor may be connected to the terminals of the semiconductor device. In this case, the communication holes have diameters large enough for the contactor to be inserted into the communication holes. Alternatively, both the contactor and the terminals may be inserted into the communication holes.

Also, although an electrical connection unit provided on an elastic sheet is the contactor in the above embodiments, the present invention is not limited thereto. Various units may be used as long as the units are connected to the terminals of the semiconductor device. For example, a pogo pin including a pin that is elastically supported by a spring may act as the contactor, and others may be considered.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An insert for a handler in which a semiconductor device including a plurality of terminals is received and which allows the semiconductor device to contact an external contactor, the insert comprising:

an insert body that has a through-hole which is formed in a central portion of the insert body and into which the semiconductor device is to be inserted; and a support member that crosses the through-hole to be detachably coupled to the insert body and supports the semiconductor device inserted into the through-hole, wherein a plurality of communication holes are formed to correspond in position to the terminals of the semiconductor device and to pass through the support member from a top surface to a bottom surface of the support member such that the terminals and the external contactor are brought into contact with each other, and wherein the support member, which is a thin sheet, is formed of a synthetic resin.

2. The insert of claim 1, wherein the thin sheet is a Kapton film having a high thermal resistance and a low thermal expansion coefficient.

3. The insert of claim 1, wherein the thin sheet is any one of an FR4 film, an FR5 film, an XPC film, and a polyimide film.

4. The insert of claim 1, wherein the communication holes have diameters large enough for the terminals to be inserted into the communication holes, and thus, the terminals contact the external contactor through the communication holes.

5. The insert of claim 1, wherein the communication holes have diameters large enough for the external contactor to be inserted into the communication holes, and thus, the terminals contact the external contactor through the communication holes.

6. The insert of claim 1, wherein the support member is coupled to a lower end of the insert body with bolts.

* * * * *